US008704177B2

(12) United States Patent
Kubo et al.

(10) Patent No.: US 8,704,177 B2
(45) Date of Patent: Apr. 22, 2014

(54) ELECTRON MICROSCOPE, ELECTRON-MICROSCOPE IMAGE-RECONSTRUCTION SYSTEM AND ELECTRON-MICROSCOPE IMAGE-RECONSTRUCTION METHOD

(75) Inventors: Takashi Kubo, Hitachinaka (JP); Hiroyuki Kobayashi, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/883,989

(22) PCT Filed: Oct. 14, 2011

(86) PCT No.: PCT/JP2011/005750
§ 371 (c)(1),
(2), (4) Date: May 7, 2013

(87) PCT Pub. No.: WO2012/073424
PCT Pub. Date: Jun. 7, 2012

(65) Prior Publication Data
US 2013/0234024 A1 Sep. 12, 2013

(30) Foreign Application Priority Data
Nov. 30, 2010 (JP) ................................. 2010-265895

(51) Int. Cl.
*G01N 23/00* (2006.01)
*G21K 7/00* (2006.01)

(52) U.S. Cl.
USPC ............ 250/310; 250/306; 250/307; 250/311

(58) Field of Classification Search
USPC .................. 250/306, 307, 310, 311
See application file for complete search history.

(56) References Cited

U.S. PATENT DOCUMENTS

| 6,963,067 | B2* | 11/2005 | Takeuchi et al. .................. 850/9 |
| 7,164,128 | B2* | 1/2007 | Miyamoto et al. ............ 250/311 |
| 7,365,325 | B2* | 4/2008 | Miyamoto et al. ............ 250/311 |
| 7,935,927 | B2* | 5/2011 | Miyamoto et al. ............ 250/311 |
| 8,158,938 | B2* | 4/2012 | Miyamoto et al. ............ 250/307 |
| 8,309,919 | B2* | 11/2012 | Obara et al. .................. 250/306 |
| 8,497,476 | B2* | 7/2013 | Hatakeyama et al. ........ 250/310 |

(Continued)

OTHER PUBLICATIONS

Frank, Joachim, "Electron Tomography: Methods for Three-Dimensional Visualization of Structures in the Cell", Second Edition (2005), pp. 180-183, 225-234 and 264, Springer, New York.

(Continued)

*Primary Examiner* — David A Vanore
(74) *Attorney, Agent, or Firm* — Miles & Stockbridge P.C.

(57) ABSTRACT

There is provided an image-reconstruction system capable of implementing a multi-axes reconstruction technique for lessening a burden on the part of a user, and precluding artifacts high in contrast, contamination of a sample, and restrictions imposed on a sample for use, occurring due to use of markings.

A plurality of tilt-images photographed by tilting a sample at sample-tilt axes, differing from each other; are acquired, misregistration is corrected by a rotation step-angle, a rotated object under observation is tilted in angle-steps, differing from each other, to pick up images thereof, two reconstruction images obtained by correcting respective misregistrations of two reconstruction images created from respective tilt-image groups are created, and one reconstruction image is created by superimposing one of the two reconstruction images on the other.

22 Claims, 13 Drawing Sheets

(56) References Cited

U.S. PATENT DOCUMENTS

| | | | |
|---|---|---|---|
| 2008/0224040 A1* | 9/2008 | Nagaoki et al. | 250/311 |
| 2012/0312986 A1* | 12/2012 | Zewail | 250/307 |
| 2012/0326033 A1* | 12/2012 | Shiono et al. | 250/310 |
| 2013/0234024 A1* | 9/2013 | Kubo et al. | 250/307 |
| 2013/0299715 A1* | 11/2013 | Tomita et al. | 250/396 R |

OTHER PUBLICATIONS

Baba, Norio, et al., "A Novel Method of Reconstructing a Tomogram by Convergence of an Innumerable Dots Map Without the 'Missing-Wedge' Effect", Frontiers of Electron Microscopy in Materials, S-15, Session-1, Oct. 2, 2009.

Batenburg, K.J., et al., "3D imaging of nanomaterials by discrete tomography", Ultramicroscopy 109 (2009), pp. 730-740.

* cited by examiner

ELECTRON MICROSCOPE, ELECTRON-MICROSCOPE IMAGE-RECONSTRUCTION SYSTEM AND ELECTRON-MICROSCOPE IMAGE-RECONSTRUCTION METHOD

TECHNICAL FIELD

The invention relates to a system for reconstructing a three-dimensional structure from a two-dimensional image obtained using an electron microscope, and a method for reconstructing the three-dimensional structure.

BACKGROUND ART

There has since been an increase in the needs for more intuitionally observing a structure of an object under observation by reconstructing a three-dimensional structure from a two-dimensional image acquired by an electron microscope, and extracting an optional spot from a reconstruction image to be thereby quantified. In order to make such an observation as described, use is generally made of a back-projection method (refer to Nonpatent Document 1, pp. 228-231) whereby respective continuously tilted two-dimensional images obtained by continuously tilting an object under observation are back-projected from respective tilt angles at the time of image acquisition to thereby reconstruct a three-dimensional image, and a technique (refer to Nonpatent Document 1, pp. 231-234) whereby the respective continuously tilted two-dimensional images are assumed as true-value images in respective projection directions, and algebratical reconstruction is executed such that an error between the projection result of each unknown three-dimensional image and a relevant true-value image will be at the minimum.

Further, as techniques for reducing an information-incomplete region, which is a problem point of those techniques described as above, there are available various techniques including a technique (refer to refer to Nonpatent Document 1, pp. 225-228 and p. 264) whereby a sample is tilted at sample-tilt axes, differing from each other, and a plurality of three-dimensional reconstruction images, each thereof using respective tilt-images as photographed, are superimposed one on another, a Dots concentration reconstruction technique (refer to refer to Nonpatent Document 2) whereby an image is regarded as an aggregate of dots, and dots configuration of a three-dimensional image is optimized on the basis of the respective continuously tilted two-dimensional images, and a discrete algebraic reconstruction technique (Dart) (refer to refer to Nonpatent Document 3) whereby a reconstruction image serving as a reference is created by an algebraic reconstruction method, the reconstruction image is divided into regions according to a threshold, and subsequently, the algebraic reconstruction method is applied again using information pieces in the respective regions.

CITATION LIST

Patent Literature

Nonpatent Literature

Nonpatent Document 1: Jose-Maria Carazo et al., Algorithms for 3D reconstruction, Joachim Frank, ELECTRON TOMOGRAPHY 2 (2005) Springer, New York, pp. 180-183, pp. 225-234, and p. 264.
Nonpatent Document 2: N. Baba, et al., Anovel Method of Reconstructing a Tomogram by Convergence of an Innumerable Dots Map without the "Missing-Wedge" Effect, Frontiers of Electron Microscopy in Materials, S-15, Session-1, 20 Oct. 2009.
Nonpatent Document 3: K. J. Batenburg, et al., 3D imaging of nanomaterials by discrete tomography, Ultramicroscopy 109 (2009), pp. 730-740.

SUMMARY OF INVENTION

Technical Problem

With the three-dimensional reconstruction technique described in Nonpatent Document 1, the information-incomplete region can be reduced, and with respect to the reconstruction image, false images, and image-missing can be reduced. The three-dimensional image reconstruction technique is a technique whereby the sample is tilted at the sample-tilt axes, differing from each other, and the plural three-dimensional reconstruction images, each thereof using the respective tilt-images as photographed, are superimposed one on another, thereby creating a three-dimensional reconstruction image where the false images, and image-missing, occurring due to presence of the information-incomplete region, are reduced. Accordingly, in order to execute the image reconstruction technique described, there is the need for the plural three-dimensional reconstruction images, each thereof using the respective tilt-images photographed by tilting the sample at the sample-tilt axes, differing from each other. Further, when the plural three-dimensional reconstruction images are superimposed one on another, there will arise the need for correcting mutual misregistration.

In order to obtain the respective tilt-images photographed by tilting the sample at the sample-tilt axes, differing from each other, a sample used to be directly rotated using a pair of tweezers, or a sample used to be manually rotated by a remote controller, using a holder provided with a rotating sample-hold part, in the past. Accordingly, capturing of the respective tilt-images for use in the image reconstruction technique has not been automated and therefore, photographing of the respective tilt-images used to cause a large burden on the part of a user.

For correction of the misregistration occurring when the plural three-dimensional reconstruction images are superimposed one on another, a technique whereby markings such as gold particles are applied to a sample is used, and the coordinates of these markings are aligned with each other.

FIG. 15 is a screen view showing a schematic diagram of a reconstruction image of a sample with markings applied thereto. In the case of the technique described as above, because markings high in contrast are used, a number of artifacts 43 generated from the marking 42 show up on a three-dimensional reconstruction image 40 in the screen view, thereby erasing the structure of an object 41 under observation. Further, because the markings are applied to the object 41 under observation, there is a possibility that the object under observation can be contaminated by the markings. Furthermore, the marking ends up in localization depending on a sample type, so that some markings cannot be used for alignment.

Thus, in the case of the three-dimensional reconstruction technique described in Nonpatent Document 1, an algorithm is established, however, this technique has problems including a problem of restrictions imposed on a sample, due to the use of an alignment algorithm using the markings, and a problem in that the artifacts generated from the marking are high in contrast at the time of performing the three-dimensional reconstruction, so that the structure of an object under observation is erased. As a result, the three-dimensional reconstruction technique has seldom been in practical use. Even if the technique has been put to practical use, a large burden has been imposed on a user because the technique is not automated.

It is therefore an object of the invention to provide a system whereby a process of acquiring respective tilt-images photographed by tilting the sample at the sample-tilt axes, differing from each other, is automated, and an alignment algorithm without use of a marking is mounted therein, thereby enabling implementation of a multi-axes reconstruction technique for lessening a burden on the part of a user, and precluding artifacts high in contrast, contamination of a sample, and restrictions imposed on a sample for use, occurring due to use of markings.

Solution to Problem

In accordance with one aspect of the invention, there is provided an electron-microscope image-reconstruction method comprising the steps of acquiring a plurality of tilt-images photographed by tilting a sample at sample-tilt axes, differing from each other, correcting misregistration by a rotation step-angle, tilting a rotated object under observation in angle-steps, differing from each other, to pick up images thereof, creating two reconstruction images obtained by correcting respective misregistrations of two reconstruction images created from respective tilt-image groups, and creating one reconstruction image by superimposing one of the two reconstruction images on the other.

More specifically, the problem can be solved by providing a first storage means for tilting an object under observation at angle steps differing from each other, and storing a first tilted-image group acquired by a photographing unit, a rotation means for correcting misregistration of the object under observation by a rotation step-angle to thereby rotate the object under observation up to a set rotation angle, a second storage means for tilting the object under observation rotated by the rotation means, at angle-steps differing from each other, and storing a second tilted-image group acquired by a photographing unit, and an operation means for creating third, and fourth reconstruction images, obtained by correcting misregistrations of first and second reconstruction images, respectively, the first and second reconstruction images being created from the first and second tilted-image groups, respectively, thereby creating a fifth reconstruction image by superimposing the third, and fourth reconstruction images one on the other.

Advantageous Effects of Invention

With the present invention, it is possible to considerably reduce a burden imposed on a user at the time of acquiring a plurality of the tilt-images necessary for application of the multi-axes reconstruction technique. Furthermore, artifacts high in contrast, contamination of a sample, and restrictions imposed on a sample for use, occurring due to use of markings, can be precluded.

DESCRIPTION OF EMBODIMENTS

Embodiments of the invention are described hereinafter with reference to the accompanied drawings.

First Embodiment

The configuration of an electron microscope, and an image processing method, according to the invention, are described. In the case of the reconstruction technique described in Nonpatent Document 1, pp. 225-228, pp. 264, it is intended to reduce the false image of a reconstruction image, and image-missing, occurring due to presence of an information-incomplete region, by creating one reconstruction image with the use of not less than two continuously tilted images acquired by tilting the same sample at axes differing from each other.

The object of the invention is to provide a system capable of implementing the reconstruction technique described in Nonpatent Document 1, whereby photographing of respective continuously tilted-images necessary in the reconstruction technique is automated, and a misregistration-correction algorithm without use of a marking is mounted therein, thereby lessening a burden on the part of a user, and precluding restrictions imposed on a sample for use. In the embodiment described hereinafter, there is described an example in which one reconstruction image is created using two continuously tilted-images acquired by tilting the same sample at axes differing from each other, however, the case of using not less than two tilt-axes is equivalent to the case where this example is executed plural times, and therefore, an underlying principle is the same. Further, it is to be understood that the scope of the claims be not limited by the present embodiment of the invention.

Figure 1:
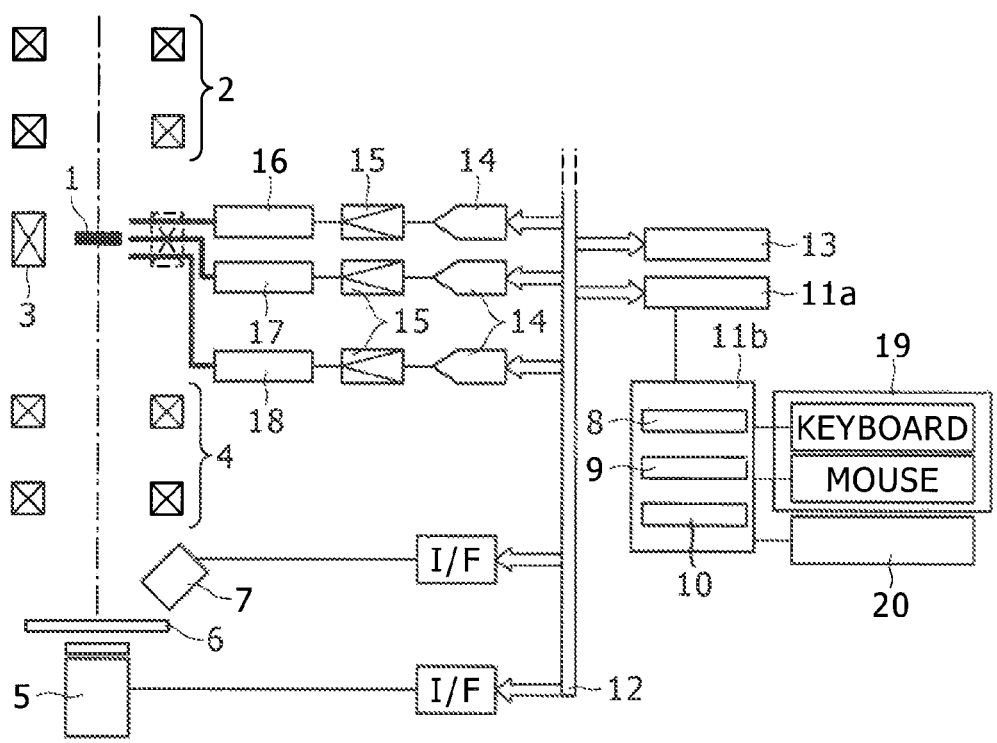
FIG. 1 is a block diagram of a system incorporating an electron microscope.

FIG. 1 is a block diagram of a system incorporating an electron microscope according to the invention. The electron microscope according to the invention is provided with an irradiation lens system 2 for irradiating a sample 1 with an electron beam, an objective lens system 3 for focusing on the sample, a magnifying lens system 4 for magnifying an electron beam image transmitted through the sample, a first image detector 5 for detecting a magnified image, a second image detector 7 for detecting a image displayed on a florescent circle 6, a computer 8 for executing various arithmetic sequence processing, an operation unit 9 inside the computer, a memory 10 for storing data, communication interfaces 11a, 11b, for use in communications between the computer and a microprocessor, the microprocessor 13 for transmitting a control signal via a bus 12, a DAC 14 for converting a digital signal outputted from the microprocessor 13 into an analog signal, a power supply 15 for amplifying a signal outputted from the DAC 14 to be outputted to a sample-tilting unit 16, a sample-rotating unit 17, and a sample-transfer unit 18, an input unit 19 for executing parameter input, and an output unit 20 for outputting an image.

Figure 2:
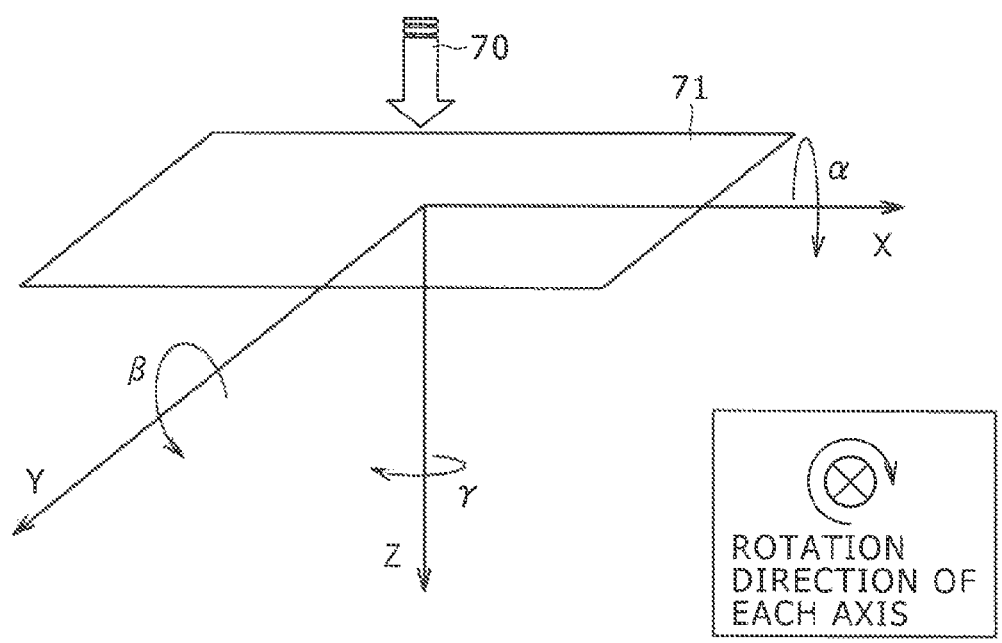
FIG. 2 is a perspective view showing the definition of coordinates.
Figure 3:
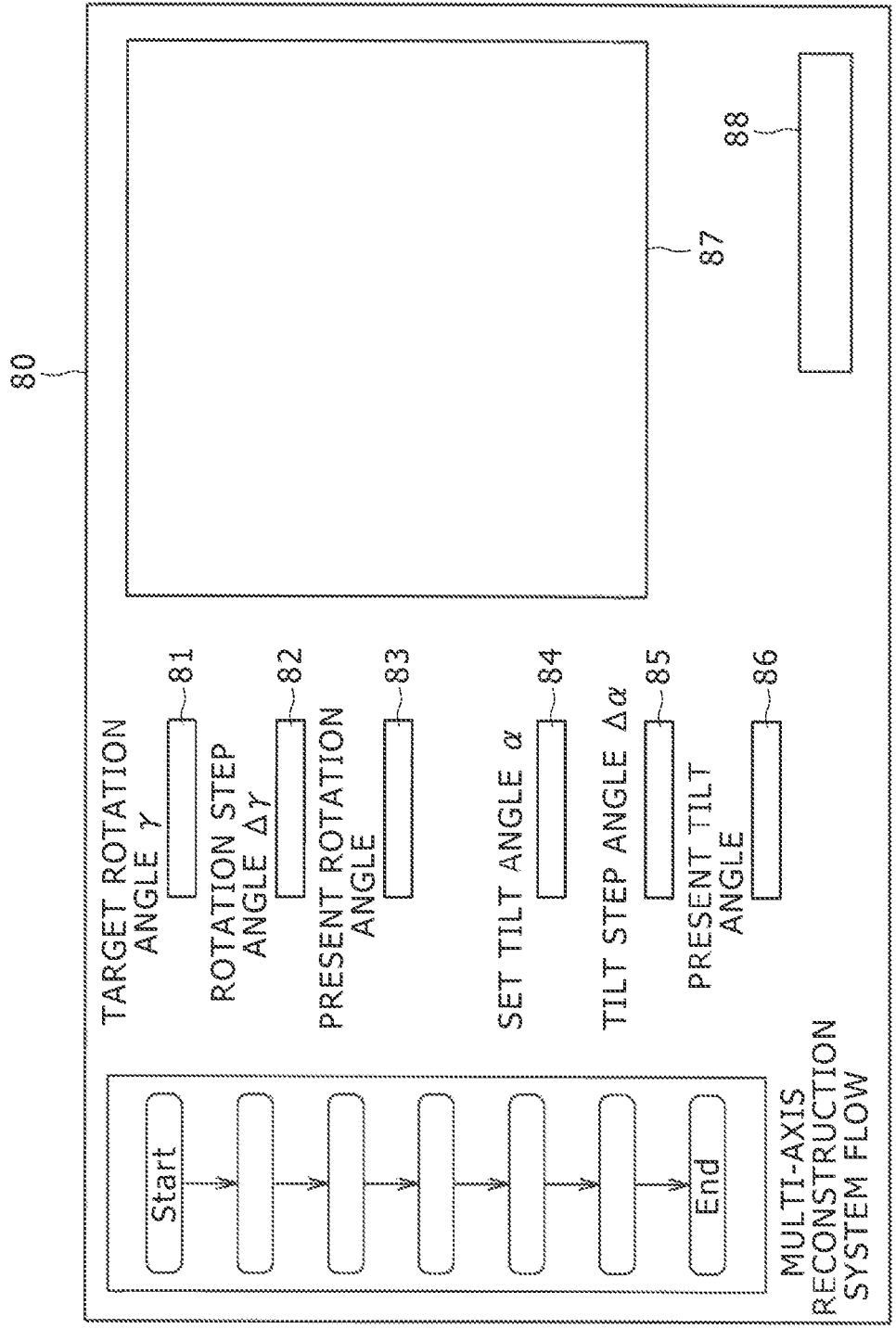
FIG. 3 is a screen view of a GUI of the present system, displayed in the output unit.

FIG. 2 is a perspective view showing the definition of coordinates according to the invention. An irradiation direction of an electron beam 70 is defined Z, and a photograph image 71 detected by the first image detector 5, and the second image detector 7, respectively, is defined an XY-plane image. Further, rotation angles at respective axes are defined such that a rotation angle at an x-axis is $\alpha$, a rotation angle at a y-axis is $\beta$, and a rotation angle at a z-axis is $\gamma$. FIG. 3 is a screen view of a GUI of the present system, displayed in the output unit 20. In a main window 80 of the GUI, there are shown four numerical value input parts, in total, including a target rotation-angle input part 81, a rotation step-angle input part 82, a set tilt-angle input part 84, a tilt step-angle input part 85, and two numerical value display parts, in total, including a present rotation-angle display part 83, and a present tilt-angle display part 86. Furthermore, a photograph-image display part 87 for displaying a photograph-image is shown therein. Processing can be executed by pushing an image-fetch execution button 88 after an optional parameter is inputted to the four numerical value input parts, respectively.

Figure 4:
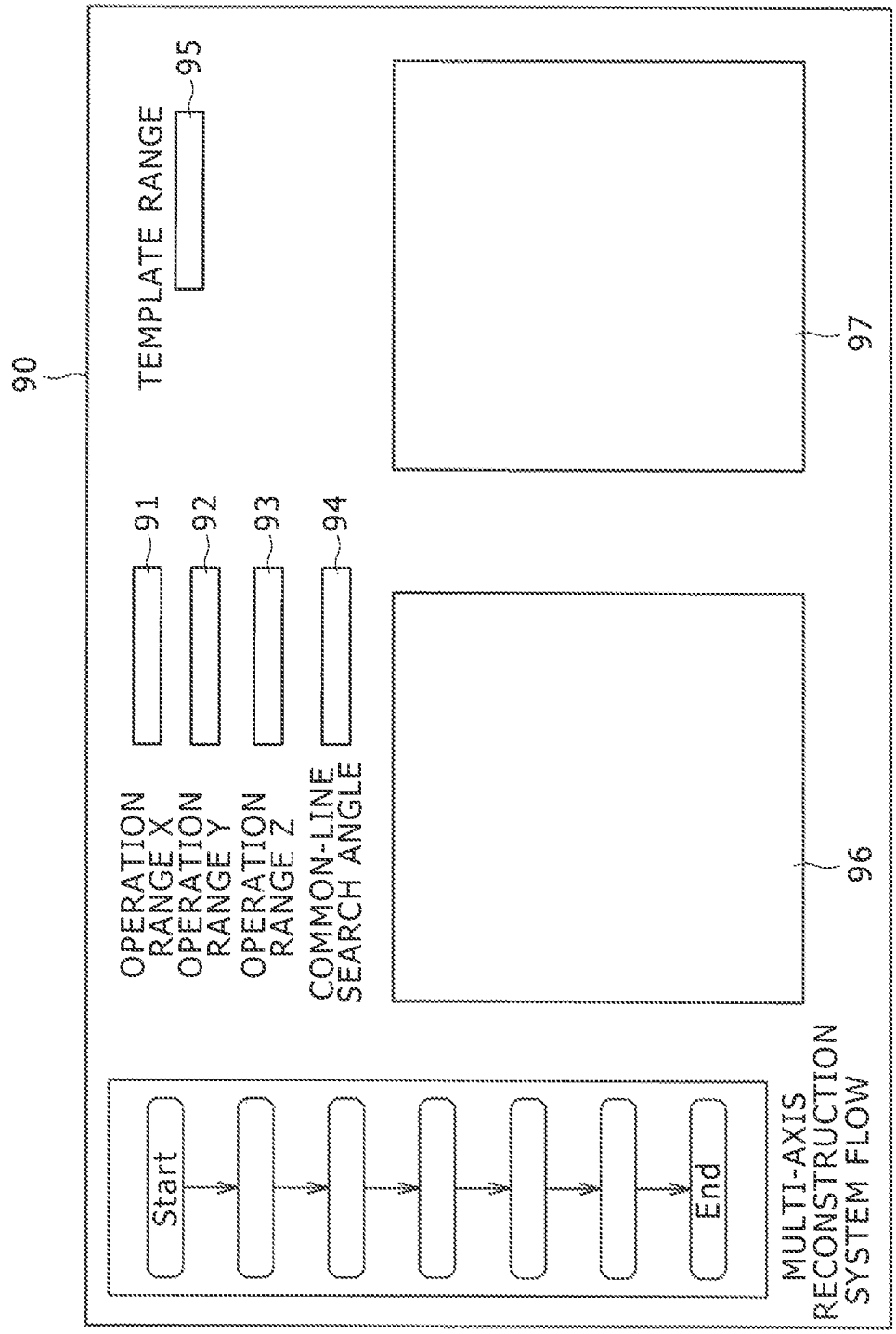
FIG. 4 is a screen view of a multi-axes reconstruction GUI displayed in the output unit.

In addition to the GUI described as above, the present system has a GUI shown in the next drawing. FIG. 4 is a screen view of a multi-axes reconstruction GUI displayed in the output unit 20. In a window 90 of the multi-axes reconstruction GUI, there are shown five input parts, in total, including an operation range X input part 91, an operation range Y input part 92, an operation range Z input part 93, a common-line search-angle input part 94, and a template range input part 95, and two image-display parts, including a reconstruction-image (1) display part 96, and a reconstruction-image (2) display part 97. Five values inputted in the present GUI are used during an operation for alignment of three-dimensional images, described later on. Further, as for each of the five values used in the operation for alignment, a default value is decided, and in the case of an operation being executed at a default value, the present GUI need not be displayed.

Figure 5:
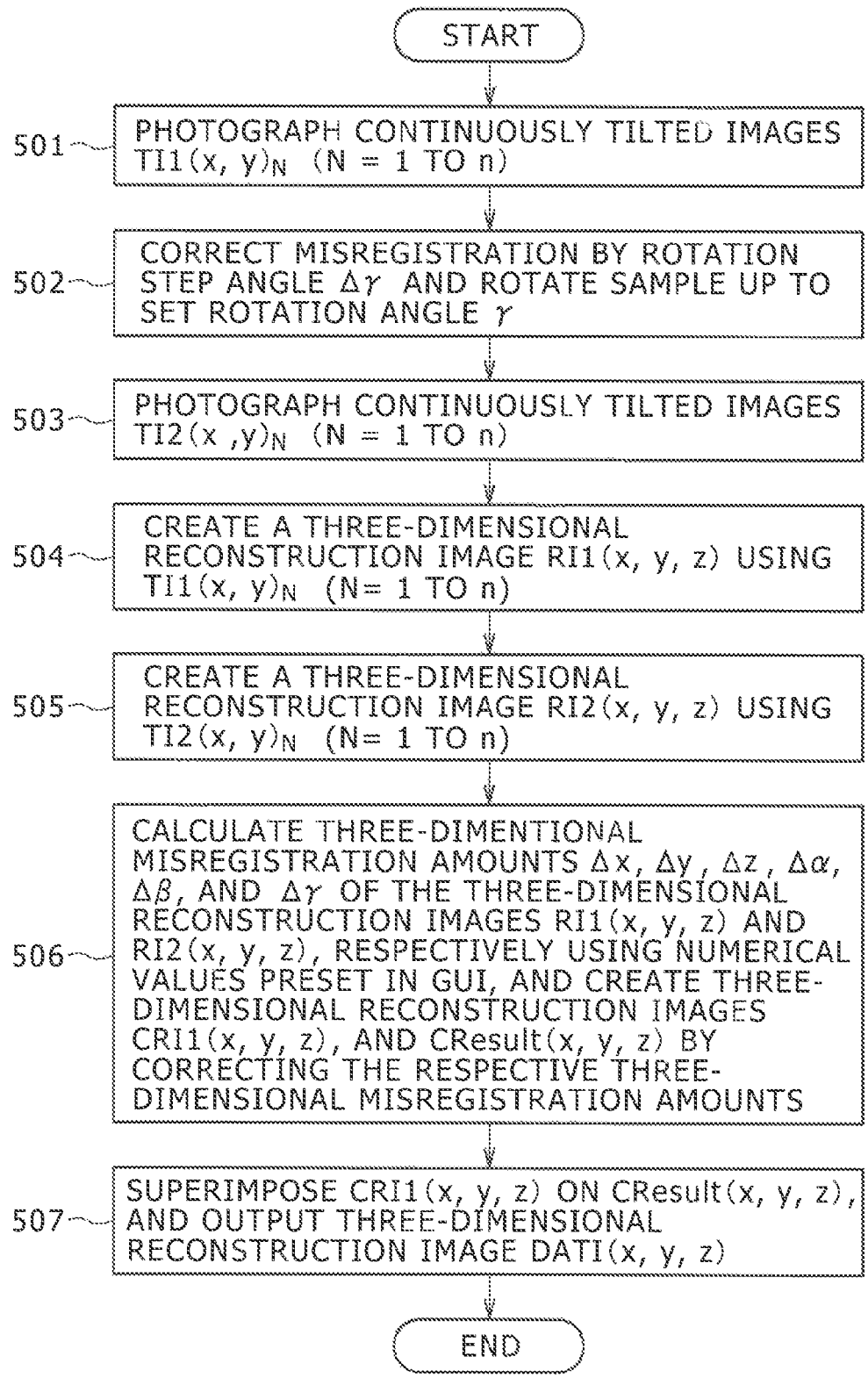
FIG. 5 is a flow chart showing a procedure for creating a three-dimensional reconstruction image DATI (X, Y, Z) according to a first embodiment of the invention.

FIG. 5 is a flow chart showing a procedure for creating a three-dimensional reconstruction image DATI (X, Y, Z) according to a first embodiment of the invention. In step 501, a tilt-angle range $\alpha$ and a tilt step-angle $\Delta\alpha$ set in the input unit 19 are transmitted from the respective communication interfaces 11a, 11b to the microprocessor 13 via the bus 12. Thereafter, the tilt-angle range $\alpha$ and the tilt step-angle $\Delta\alpha$ outputted from the microprocessor 13 are inputted to DAC 14 via the bus 12 to be amplified by the power supply 15 to be subsequently outputted to the sample-tilting unit 16. Thereafter, the sample 1 is continuously tilted by the tilt step-angle $\Delta\alpha$ within the tilt-angle range $\alpha$ by the sample-tilting unit 16, whereupon images at respective tilt-angles are detected by the first image detector 5. The images at the respective tilt-angles, detected by the first image detector 5, are stored as images of continuously tilted images from TI1 (X,Y)-1 to TI1 (X,Y)-N, in the memory 10 inside the computer.

In step 502, a rotation angle $\gamma$ and a rotation step-angle $\Delta\gamma$ set in the input unit 19 are transmitted from the respective communication interfaces 11a, 11b to the microprocessor 13 via the bus 12, Thereafter, the rotation angle $\gamma$ and the rotation step-angle $\Delta\gamma$ outputted from the microprocessor 13 are inputted to DAC 14 via the bus 12 to be amplified by the power supply 15, before being outputted to the sample-rotating unit 17. The sample 1 is subjected to misregistration-correction by the rotation step-angle $\Delta\gamma$ using the sample-transfer unit 18 to be rotated up to the rotation angle $\gamma$.

In step 503, images of continuously tilted images from TI2 (X, Y)-1 to TI2 (X, Y)-N are stored in the memory 10 inside the computer as is the case with the step 501.

In steps 504 and 505, the tilt-images photographed in the steps 501 and 503, respectively are used to be subjected to three-dimensional reconstruction by the operation unit 9, thereby creating three-dimensional reconstruction images RI1 (X,Y, Z) and RI2 (X,Y, Z), respectively to be stored in the memory 10.

In step 506, three-dimensional misregistration amounts $\Delta X$, $\Delta Y$, $\Delta Z$, $\Delta\alpha$, $\Delta\beta$, and $\Delta\gamma$ of the three-dimensional reconstruction images RI1 (X,Y, Z) and RI2 (X,Y, Z), respectively are calculated by the operation unit 9. Thereafter, three-dimensional reconstruction images CRI1 (X,Y, Z) and CResult (X, Y, Z) are created, respectively by correcting the respective three-dimensional misregistration amounts to be subsequently stored in the memory 10.

Finally, in step 507, the three-dimensional reconstruction image CRI1 (X, Y, Z) and the three-dimensional reconstruction image CResult (X, Y, Z) are g one on the other, thereby enabling a three-dimensional reconstruction image DATI (X, Y, Z) to be created with the false image and the image missing caused due to presence of an information-incomplete region, being reduced in the three-dimensional reconstruction image DATI (X, Y, Z).

A sample-rotation processing executed in the step 502 shown in FIG. 5 is broadly described hereinafter. First, a precondition for the sample-rotation processing is given. In the case of this processing, it is assumed that, in a state where the sample 1 is not inserted in advance, and the diameter of the electron beam is mot less than the diameter of the florescent circle 6, one image is photographed by the second image detector 7, a quadrangle inscribed in the florescent circle 6 is derived from the image, and the quadrangle is stored as a template range T. Further, it is assumed the counter i is defined as a variable, and an initial value 0 is inputted.

Figure 6:
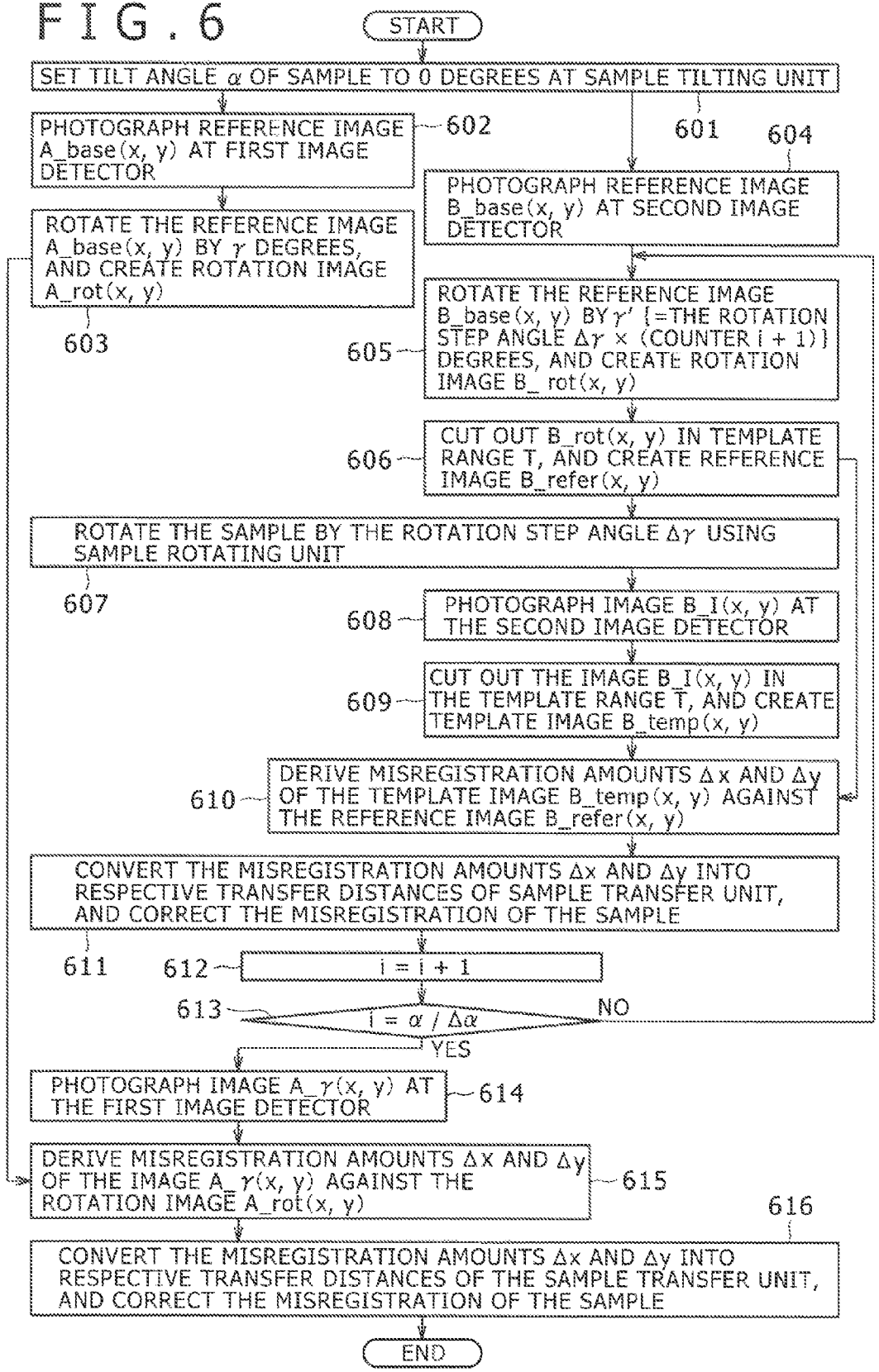
FIG. 6 is a flowchart showing a procedure for a sample-rotation processing.

FIG. 6 is a flow chart showing a procedure for the sample-rotation processing. In step 601, a sample tilt-angle $\alpha$ is set to 0 degree at the sample-tilting unit 16. In step 602, a reference image A_base (X, Y) is photographed using the first image detector 5 to be stored in the memory 10. Subsequently, in step 603, the image A_base (X, Y) is rotated by $\gamma$ degrees around the electron beam irradiation direction Z as a rotation axis at the operation unit 9 to create a rotation image A_rot (X, Y).

In step 604, a reference image B_base (X, Y) is photographed by the wide range image detector 7 for photographing an image displayed on the florescent circle 6 to be subsequently stored in the memory 10. In step 605, the reference image B_base(X, Y) is rotated around the rotation axis Z by $\gamma'$ {=the rotation step-angle $\Delta\gamma\times$(counter i+1)} degrees to thereby create a rotation image B_rot (X, Y). Thereafter, in step 606, the mage B_rot (X, Y) is cut out in the template range T to be stored as a reference image B_refer (X, Y) in the memory 10.

Figure 7:
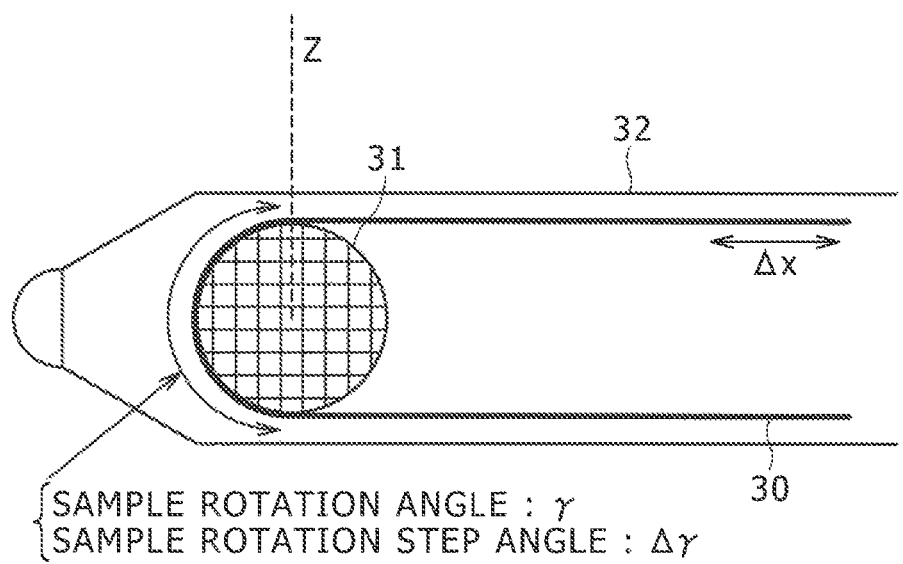
FIG. 7 is an enlarge view of a sample-holding part of a sample holder 32.

FIG. 7 is an enlarge view of a sample-holding part of a sample holder 32. In a step 607 in FIG. 6, the sample is rotated by the rotation step-angle $\Delta\gamma$ using the sample holder 32 having the sample-rotating unit 17 for rotating a sample mesh fixing part 31 through the intermediary of a wire 30, and subsequently, in step 608, an image B_I (X, Y) is photographed using the wide range image detector 7

In step 609, the image B_I (X, Y) is cut out in the template range T, as is the case with the reference image B_refer (X, Y), to thereby create a template image B_temp (X, Y). Thereafter, in step 610, misregistration amounts $\Delta X$ and $\Delta Y$ of the template image B_temp (X, Y) against the reference image B_refer (X, Y) are derived at the operation unit 9 using the reference image B_refer (X, Y) and the template image B_temp (X, Y). In step 611, the misregistration amounts $\Delta X$ and $\Delta Y$ are converted into transfer distances of the sample-transfer unit 18, respectively to thereby correct the misregistration of the sample 1 by the sample-transfer unit 18.

In step 612, and step 613, respectively, the counter i is counted up at the operation unit 9 to thereby determine sample-rotation completion (i=$\alpha/\Delta\alpha$). If a determination result is "No", the sample-rotation processing reverts to the step 605, and if the determination result is "Yes", the processing shifts to a step 614. In the case where the processing shifts to the step 614 according to the determination, an image A_$\gamma$ (X, Y) is photographed at the first image detector 5 in step 615 to be stored in the memory 10. Then, misregistration amounts $\Delta X$ and $\Delta Y$ of the image A_$\gamma$ (X,Y) against the rotation image A_rot (X, Y) are derived at the operation unit 9 using the rotation image A_rot (X, Y) and the image A_$\gamma$ (X, Y).

Finally, in step 616, the misregistration amounts $\Delta X$ and $\Delta Y$ are converted into respective transfer distances of the sample-transfer unit 18, and the misregistration of the sample is corrected using the sample-transfer unit 18.

As a result of those steps, the sample 1 can be automatically rotated by an optional rotation angle, that is, $\alpha$ degrees. The steps 504 and 505 are known techniques, and description thereof is therefore omitted.

Subsequently, the processing executed in the step 506 at the operation unit 9 is described in detail. This processing is to calculate parallel-translation misregistration amounts $\Delta X$, $\Delta Y$, $\Delta Z$, and rotational-transfer misregistration amounts $\Delta\alpha$, $\Delta\beta$, and $\Delta\gamma$ with respect to each of the two three-dimensional reconstruction images as inputted to thereby correct those misregistrations. Further, for parameters used in this processing, respective values of the operation range X input part 91, the operation range Y input part 92, the operation range Z input part 93, and the common-line search-angle input part 94 inputted in FIG. 4 as well as default values can be used.

Figure 8:
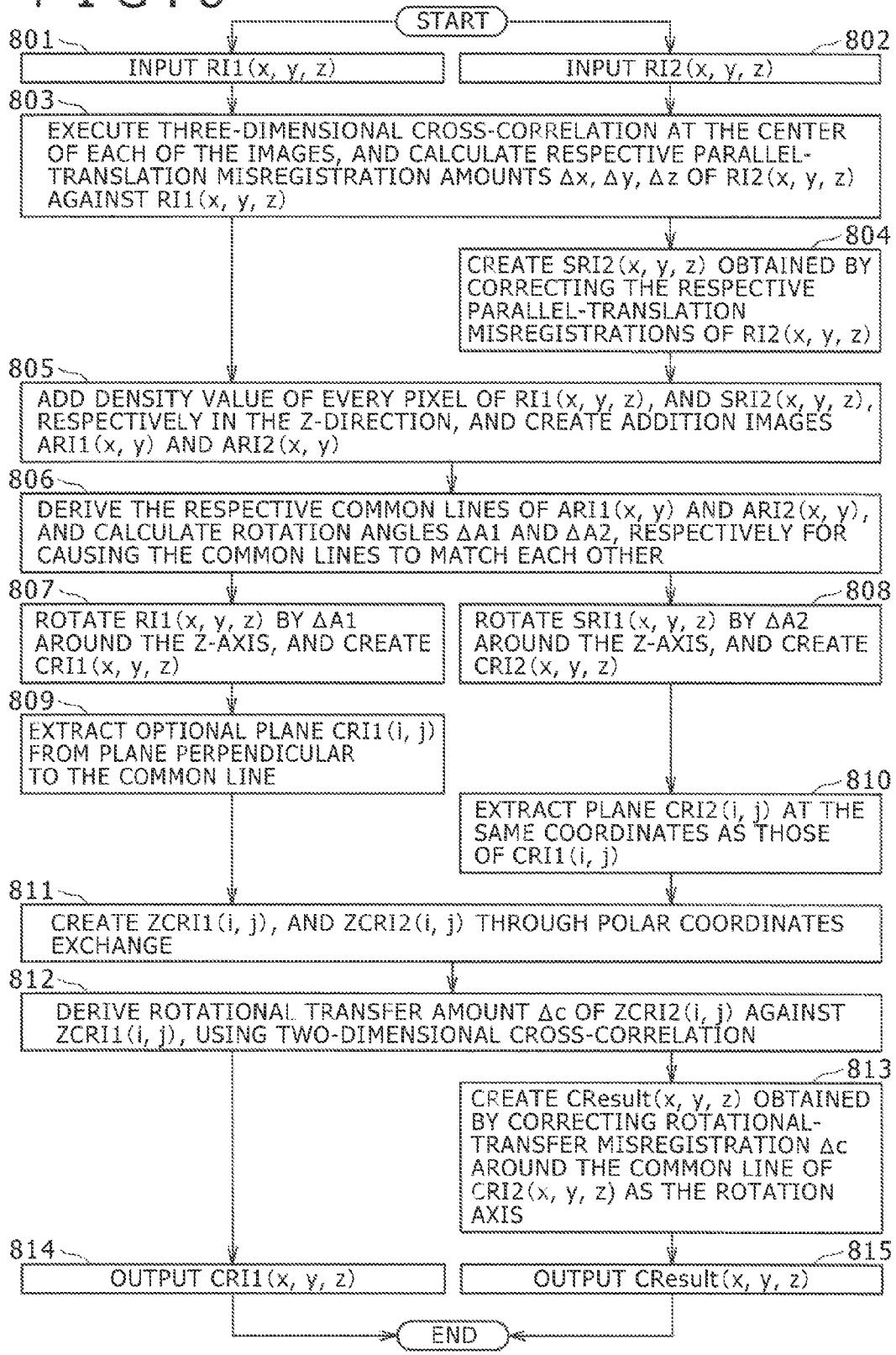
FIG. 8 is a flow chart showing a procedure for a misregistration-correction processing.

FIG. 8 is a flow chart showing a procedure for a misregistration-correction processing. In step 801, and step 802, the two three-dimensional reconstruction images RI1 (X, Y, Z), and RI2 (X, Y, Z) are each inputted, respectively. Subsequently, in step 803, three-dimensional cross-correlation is executed at the center of each of the images in order to correct the misregistrations of RI1 (X, Y, Z), and RI2 (X, Y, Z), respectively, and respective parallel-translation misregistration amounts $\Delta X$, $\Delta Y$, and $\Delta Z$ of RI2 (X,Y,Z), against RI1 (X, Y, Z), are calculated, whereupon SRI2 (X, Y, Z) obtained by correcting the respective parallel-translation misregistrations of RI2 (X, Y, Z) is created in step 804.

In step 805, density values of all the pixels of the three-dimensional reconstruction image RI1 (X, Y, Z), and the three-dimensional reconstruction image SRI2 (X, Y, Z) obtained by correcting the respective parallel-translation misregistrations of RI2 (X, Y, Z), respectively, are added in the z-direction inside the respective operation ranges X, Y, Z, thereby creating respective addition images ARI1 (X, Y, and ARI2 (X, Y).

In step 806, the addition images ARI1 (X,Y) and ARI2 (X, Y) are used, and respective common lines {described in the Document 1 (pp. 180-183)} of these images are derived therefrom. Thereafter, rotation angles $\Delta A1$ and $\Delta A2$ for causing the common lines in the respective addition images to match each other are searched with a precision of the common-line search-angle.

In step 807, the three-dimensional reconstruction image RI1 (X, Y, Z) is rotated by $\Delta A1$ around the z-axis, thereby creating a three-dimensional reconstruction image CRI1 (X, Y, Z) obtained by correcting a rotational-transfer misregistration amount $\Delta\gamma$ at the z-axis as the rotation axis. In step 808 as well, the three-dimensional reconstruction image SRI1 (X,Y, Z) is rotated by $\Delta A2$ around the z-axis, thereby creating a three-dimensional reconstruction image CRI2 (X, Y, Z) obtained by correcting a rotational-transfer misregistration amount $\Delta\gamma$ at the z-axis as the rotation axis.

In step 809, an optional plane CRI1 (i, j) is extracted from a plane perpendicular to the common line in CRI1 (X, Y, Z), and in step 810, a plane CRI2 (i, j) at the same coordinates as those of CRI1 (i, j) is extracted from CRI2 (X, Y, Z). Because the two planes CRI1 (i, j) and CRI2 (i, j) represent the results of the rotational-transfer misregistration occurring at the common line as the rotational axis, if respective misregistration amounts are calculated and corrected, this will enable respective rotational-transfer misregistrations $\Delta\alpha$ and $\Delta\beta$ at the x-axis and the y-axis, respectively as the rotational axis to be corrected. Further, with the present embodiment, as described in step 811, and step 812, respectively, the two planes are subjected to polar coordinates exchange to thereby create ZCRI1 (i, j) and ZCRI2 (i, j), and a rotational-transfer amount $\Delta c$ of ZCRI2 (i, j) against ZCRI1 (i, j) is derived from the respective results of two-dimensional cross-correlation of the two planes.

Finally, in step 813, by correcting a rotational-transfer misregistration $\Delta c$ with the use of the common line of the three-dimensional reconstruction image CRI2 (X, Y, Z) obtained by correcting the rotational-transfer misregistration amount $\Delta\gamma$ at the z-axis, as the rotation axis, it is possible to create the CResult (X,Y, Z) obtained by correcting the respective rotational-transfer misregistrations $\Delta\alpha$ and $\Delta\beta$ at the x-axis and the y-axis, respectively, as the rotational axis.

As a result of those steps, corrections of the respective three-dimensional misregistration amounts $\Delta X$, $\Delta Y$, $\Delta Z$, $\Delta\alpha$, $\Delta\beta$, and $\Delta\gamma$ of RI1 (X,Y, Z) and RI2 (X,Y, Z), respectively are completed. In steps 814 and 815, the images CRI1 (X, Y, Z) and CResult (X,Y, Z) are outputted, respectively as a result of the respective corrections. The three-dimensional misregistration amounts can be corrected by the processing described in the foregoing.

Figure 9:
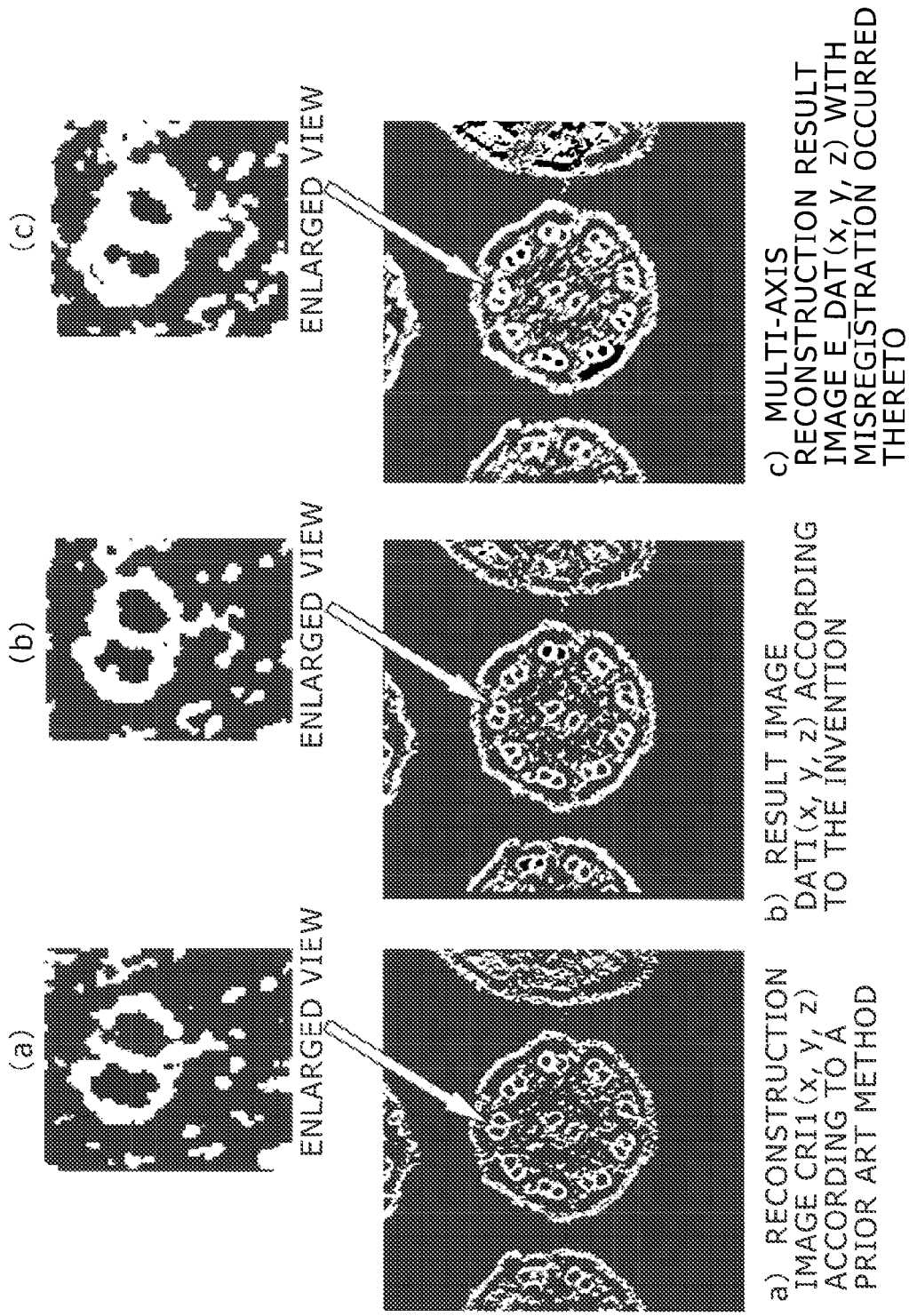
FIGS. 9(a) to 9(c) each show a screen view showing a reconstruction-result image.

FIG. 9 is a screen view showing a reconstruction-result image according to the invention, using a sample without a marking applied thereto, and a multi-axes reconstruction-result image with misregistration occurred thereto. (a) in FIG. 9 shows an intermediate sliced image (X, Y) of a reconstruction image CRI1 (X, Y, Z) according to a prior art method, created using a sample without a marking applied thereto. (b) in FIG. 9 shows an intermediate sliced image (X, Y) of the reconstruction-result image according to the invention, and (c) in FIG. 9 shows an intermediate sliced image (X,Y) of the multi-axes reconstruction-result image with misregistration occurred thereto. An enlarged view of a part indicated by an arrow is shown above each of the figures.

Upon comparison of FIG. 9 (b) with FIG. 9 (a), it is evident that a structure in the case of the reconstruction-result image according to the invention is supplemented as compared with the case of the reconstruction image according to the prior art method. The enlarged views each show an enlarged pilus including an A-capillary tube, a B-capillary tube, and a dynein arm protrusion. The two capillary tubes are each circular in shape. Further, the dynein arm protrusion is in a claw-like shape {refer to Tissue Cell Biology (2006), published by Nankaidou, pp. 26, [translation supervisor] Yasuo Uchiyama}. In the reconstruction image according to the prior art method, shown in FIG. 9 (a), the respective structures of the capillary tubes are separated from the structure of the dynein arm protrusion. In contrast, the reconstruction-result image according to the invention shows that those respective structures are connected with each other, and it is apparent that the structures are supplemented.

Further, upon comparison of (b) in FIG. 9 with (c) in FIG. 9, it is evident that alignment accuracy according to the invention is sufficient. In (c) of FIG. 9, two images each having a misregistration amount 2 piXel in the x-direction, and the y-direction, respectively, are superimposed one on the other. If two misaligned images are superimposed one on the other, this will cause defocusing, and image blurring to occur to the structure, as shown in (c) of FIG. 9, thereby causing the structure to be one different from the original structure. In contrast, with the reconstruction-result image according to the invention, defocusing, and image blurring are not observed in the structure, as compared with the reconstruction image according to the prior art method, shown in (a) of FIG. 9. More specifically, it is evident that, in the case of using an alignment method according the invention, three-dimensional misregistration can be corrected even against the sample without a marking applied thereto. Further, since no marking is applied to the sample described as above, it is obviously possible to preclude occurrence of a phenomenon in which the structure of the sample is erased due to high contrast occurring from artifacts of a marking.

In the present embodiment, an electron-beam computed tomography using an electron microscope is described by way of example; however, the invention is applicable to an x-ray computed tomography as well. Further, in the present embodiment, the case of using the continuously tilted-images is described by way of example, however, it is to be pointed out that the invention is applicable to discontinuously tilted images as well.

Further, the invention renders it possible to perform visualization and measurement of a three-dimensional shape of a semiconductor device, grain-size measurement of a catalyst particulate, observation of a distribution state thereof, and accurate three-dimensional material analysis of a nano-material, so that hopes run high that the invention will be in widespread application in a material-analysis field. It is also hoped that the invention will be applicable to visualization of an intracellular organ state, observation on a component mixture state, and so forth with respect to cell and a polymeric material, as well.

Second Embodiment

In the case of the reconstruction technique described in Nonpatent Document 1, pp. 225-228 and p. 264, it is intended that one reconstruction image is created using not less than two continuously tilted images acquired by tilting the same sample at axes differing from each other to thereby reduce the false images, and image-missing, occurring due to presence of an information-incomplete region.

In contrast, with a second embodiment of the invention, it is intended to provide a system capable of implementing the reconstruction technique described in Nonpatent Document 1, whereby photographing of respective continuously tilted-images necessary in the reconstruction technique is automated, and the misregistration-correction algorithm without use of a marking is mounted therein, thereby lessening a burden on the part of a user, and precluding restrictions imposed on a sample for use. In the embodiment described hereinafter, there is described an example in which one reconstruction image is created using the two continuously tilted-images acquired by tilting the same sample at axes differing from each other, however, the case of using not less than two tilt-axes is equivalent to the case where this example is executed plural times, and therefore, an underlying principle is the same. Further, it is to be understood that the scope of the claims be not limited by the present embodiment of the invention.

Figure 10:
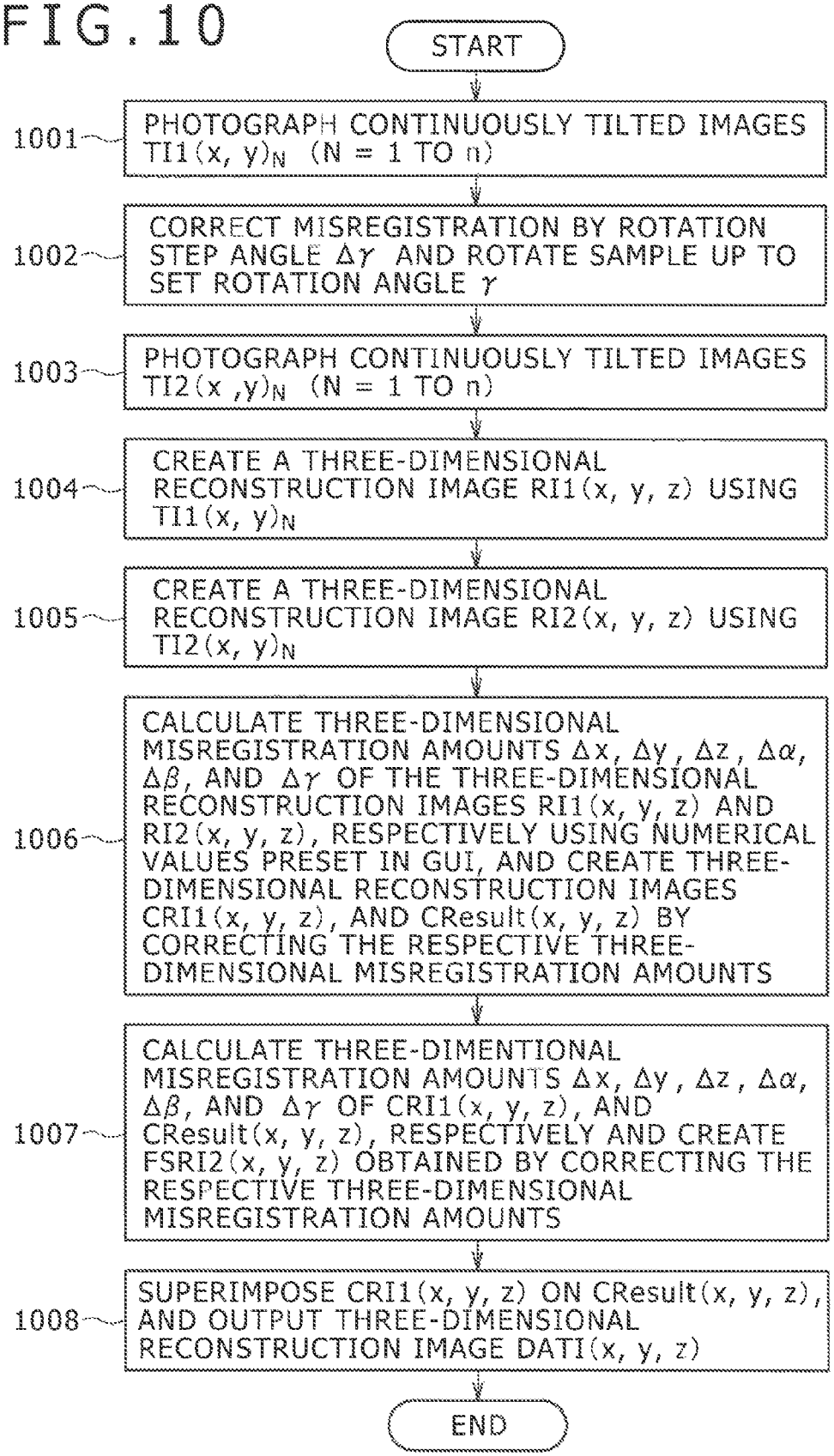
FIG. 10 is a flow chart showing a procedure for creating a three-dimensional reconstruction image DATI (X, Y, Z) according to a second embodiment of the invention.

Respective embodiments of an electron microscope, and an image processing method, according to the invention are hereinafter described. The present embodiment has a system configuration in common with the first embodiment, omitting therefore description thereof. FIG. 10 is a flow chart showing a procedure for creating a three-dimensional reconstruction image DATI (X, Y, Z).

Steps 1001 to 1006 and step 1008 are items in common with the first embodiment of the invention. Step 1007 is hereinafter described in detail.

Figure 11:
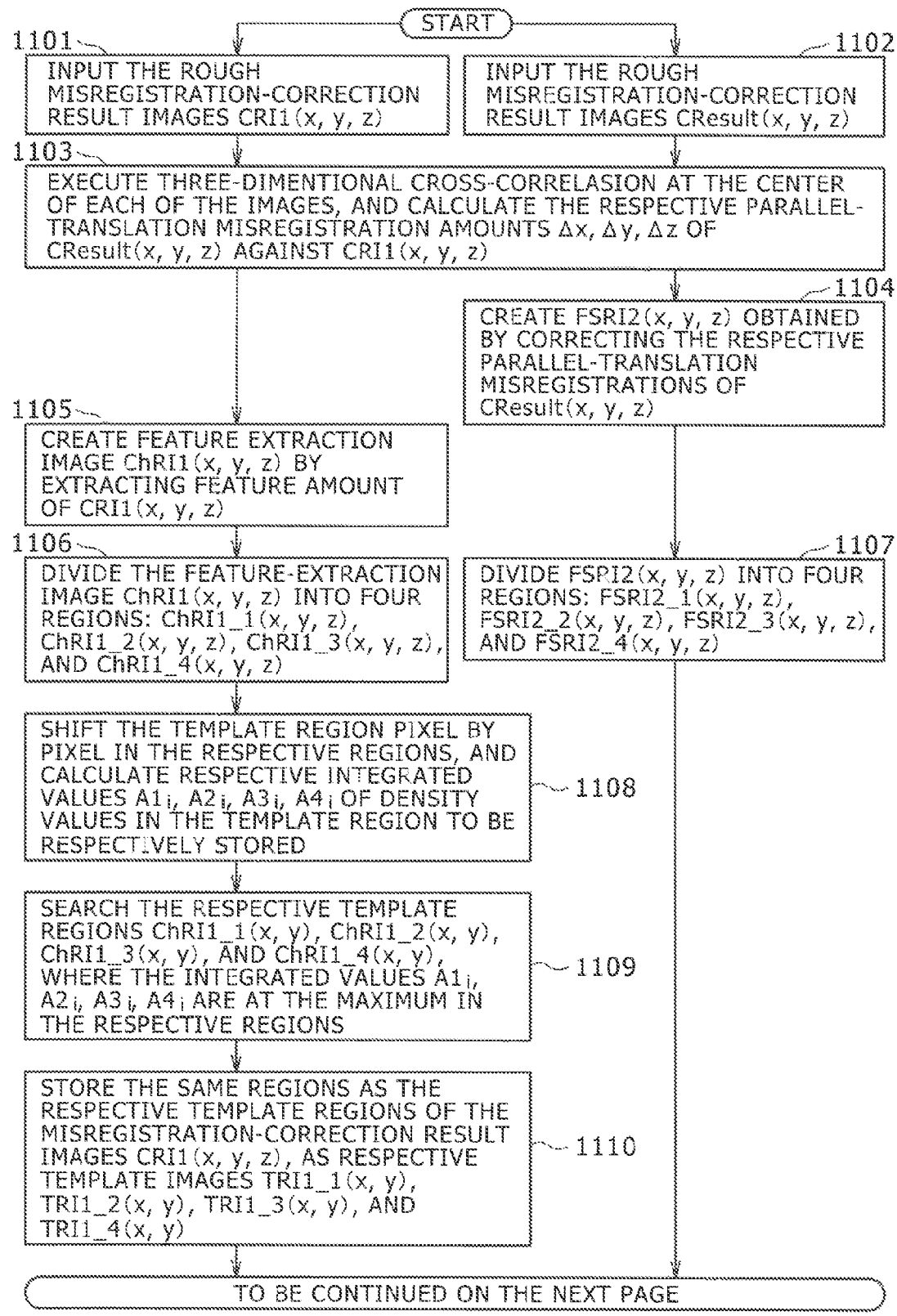
FIG. 11 is a flow chart showing a procedure for misregistration-correction processing.
Figure 12:
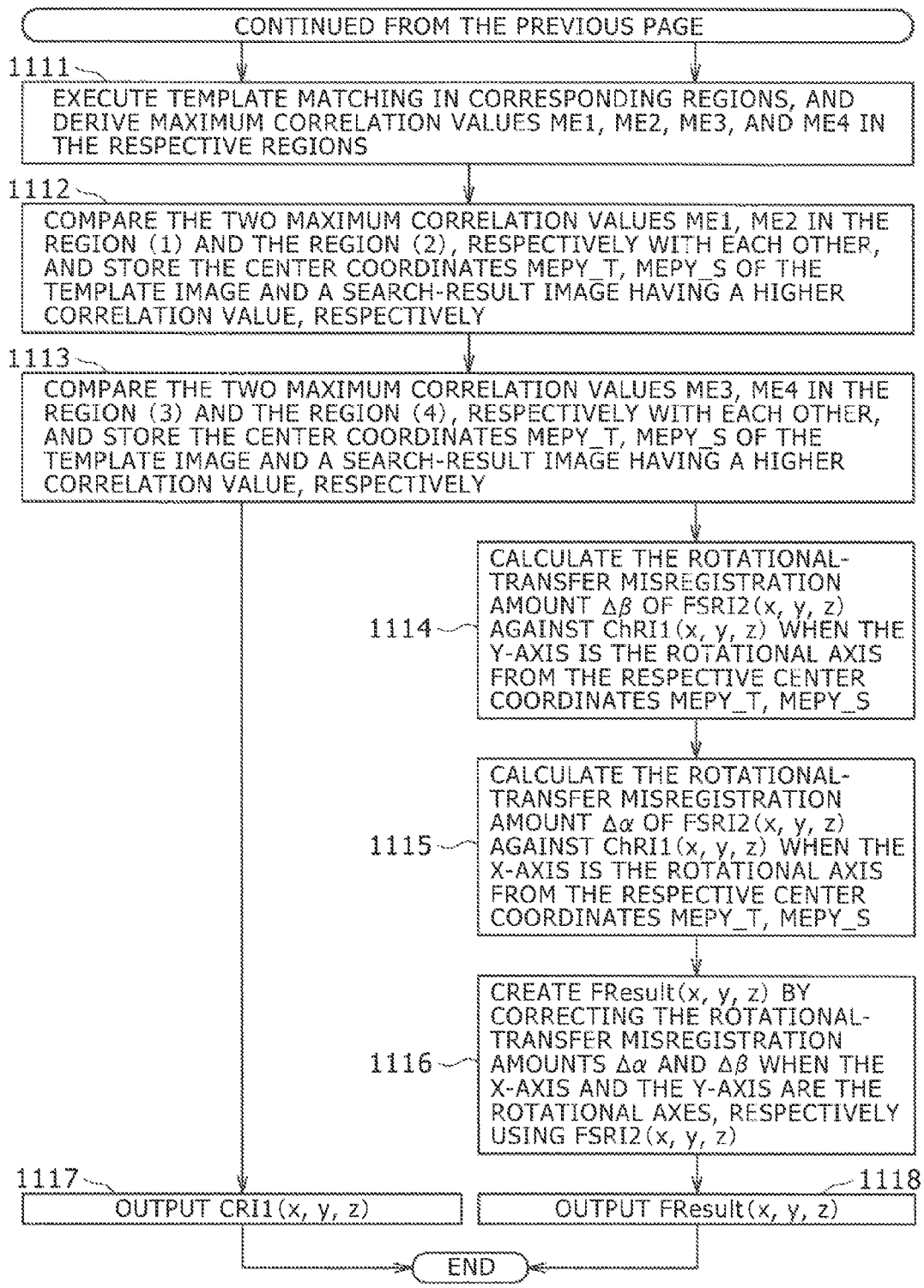
FIG. 12 is a flow chart showing the procedure for misregistration-correction processing.

FIGS. 11 and 12 each are a flow chart showing a procedure for misregistration-correction processing of a three-dimensional image, executed in step 1007. In the present processing, misregistration-correction is further applied to the three-dimensional reconstruction images CRI1 (X, Y, Z), and CResult (X, Y, Z) with misregistration-correction applied thereto in the step 1006, using an algorithm different from the misregistration-correction algorithm. In the present misregistration-correction processing, parallel-translation misregistration amounts $\Delta X$, $\Delta Y$, and $\Delta Z$, and rotational-transfer misregistration amounts $\Delta \alpha$, $\Delta \beta$, and $\Delta \gamma$ are corrected.

First, the misregistration-correction result images CRI1 (X, Y, Z), and CResult (X, Y, Z) obtained in the step 1006 are inputted in step 1101, and step 1102, respectively. In step 1103, three-dimensional cross-correlation is executed at the center of each of the images in order to correct the misregistrations of CRI1 (X, Y, Z) and CResult (X, Y, Z), respectively, and the respective parallel-translation misregistration amounts $\Delta X$, $\Delta Y$, and $\Delta Z$ of CResult (X, Y, Z) against CRI1 (X, Y, Z) are calculated, and in step 1104, FSRI2 (X, Y, Z) obtained by correcting the respective parallel-translation misregistrations of CResult (X, Y, Z) is created. In step 1105, a feature amount of CRI1 (X, Y, Z) is extracted to thereby create a feature-extraction image ChRI1 (X, Y, Z).

Figure 13:
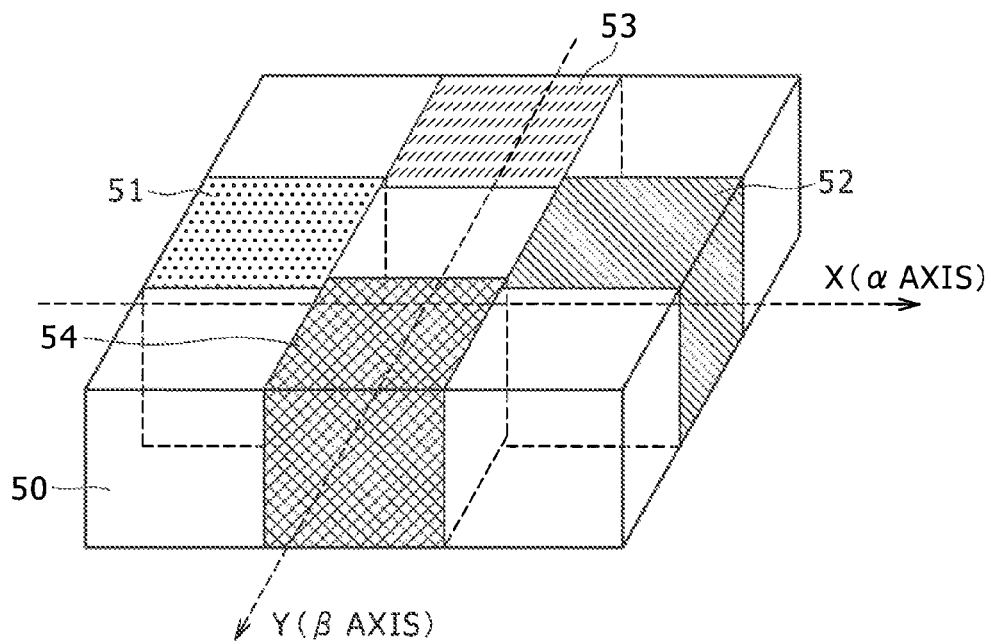
FIG. 13 is a perspective view showing a concept under which a feature-extraction image ChRI1 (X, Y, Z), and a misregistration-correction image FSRI2 (X, Y, Z) are each divided into four regions.

FIG. 13 is a perspective view showing a concept under which the feature-extraction image ChRI1 (X, Y, Z), and the misregistration-correction image FSRI2 (X, Y, Z) are each divided into four regions. For the respective scopes of the regions, a value in the template range input part 95, inputted in FIG. 4, can be used besides a default value. A rotational-transfer misregistration amount $\Delta \alpha$ at an x-axis as the rotation axis is hereinafter calculated from the divided region (1), and the divided region (2), respectively, while a rotational-transfer misregistration amount $\Delta \beta$ at a $\beta$-axis as the rotation axis is calculated from the divided region (3), and the divided region (4), respectively.

In step 1106, the feature-extraction image ChRI1 (X, Y, Z) is divided into four regions, as shown in FIG. 13, thereby creating a region (1) ChRI1_1 (X, Y, Z) 51, a region (2) ChRI1_2 (X, Y, Z) 52, a region (3) ChRI1_3 (X, Y, Z) 53, and a region (4) ChRI1_4 (X, Y, Z) 54, respectively.

In step 1107, the parallel-translation misregistration-correction image FSRI2 (X, Y, Z) is divided into four regions, as is the case with the step 1106, thereby creating a region (1) FSRI2 FSRI2_1 (X, Y, Z) 51, a region (2) FSRI2 FSRI2_2 (X, Y, Z) 52, a region (3) FSRI2_3 (X, Y, Z) 53, and a region (4) FSRI2_4 (X, Y, Z) 54, respectively.

Figure 14:
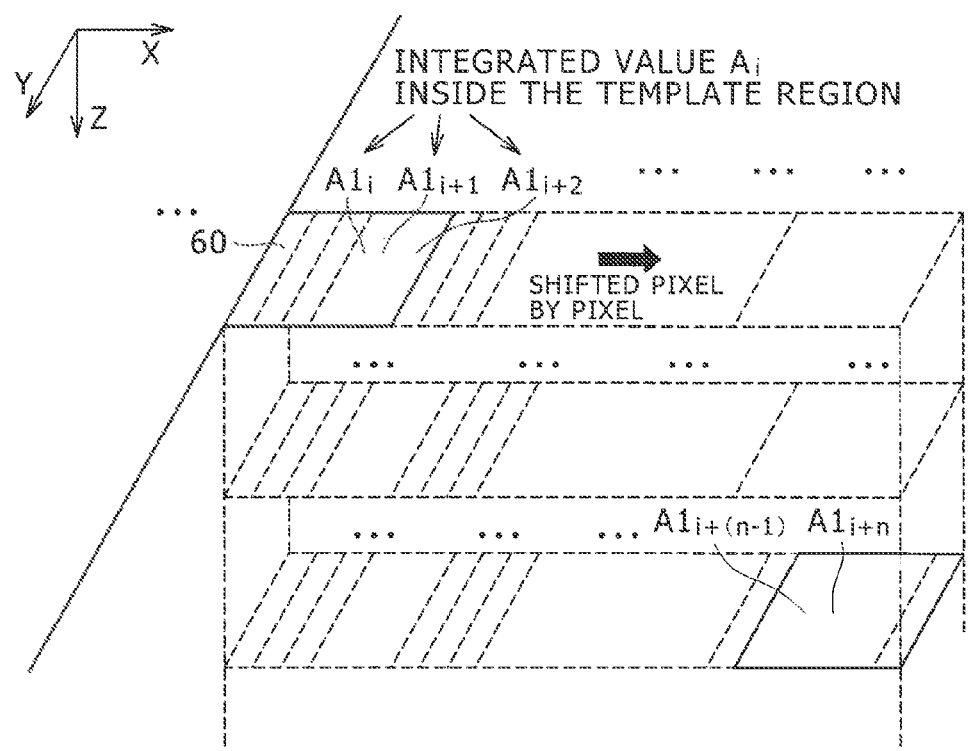
FIG. 14 is a perspective view for describing a method for searching a template region ChRI1_1 (X, Y) where a feature amount is at the maximum inside a region (1) ChRI1_1 (X, Y, Z)
Figure 15:
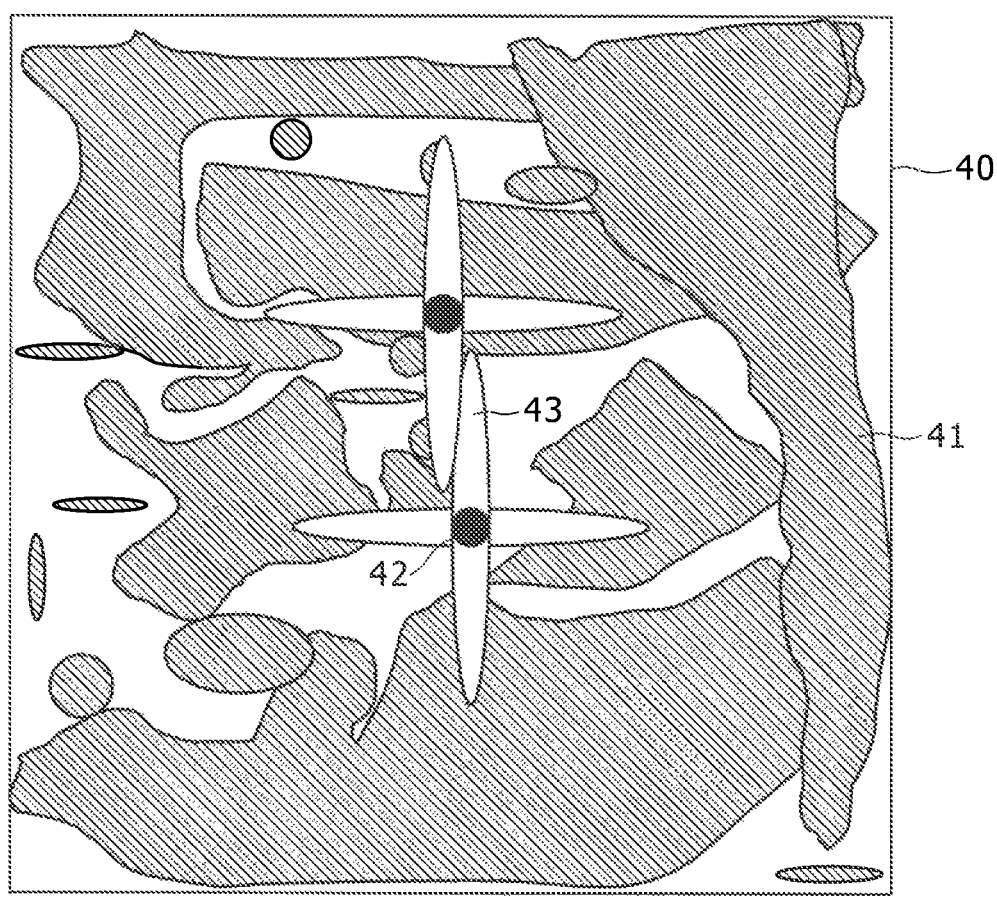
FIG. 15 is a screen view showing a schematic diagram of a reconstruction image of a sample with markings applied thereto

FIG. 14 is a perspective view for describing a method for searching the template region ChRI1_1 (X, Y) where the feature amount is at the maximum inside the region (1) ChRI1_1 (X, Y, Z). The respective template regions ChRI1_1 (X, Y), ChRI1_2 (X, Y), ChRI1_3 (X, Y), and ChRI1_4 (X, Y), where the feature amount searched by the method is at the maximum, are defined as a template, and template matching is executed, thereby calculating respective rotational-transfer misregistration amounts.

In step 1108, the template region is shifted pixel by pixel as shown in FIG. 14, in the respective regions divided in the step 1106, and respective integrated values $A_i$, $A2_i$, $A3_i$, $A4_i$ of density values in the template region are calculated to be stored respectively.

In step 1109, the respective template regions ChRI1_1 (X, Y), ChRI1_2 (X, Y), ChRI1_3 (X, Y), and ChRI1_4 (X, Y), where the integrated values $A_i$, $A2_i$, $A3_i$, $A4_i$, are at the maximum in the respective regions are searched. Subsequently, in step 1110, the same regions as the respective template regions of the misregistration-correction result images CRI1 (X, Y, Z) are stored as respective template images TRI1_1 (X, Y), TRI1_2 (X, Y), TRI1_3 (X, Y), and TRI1_4 (X, Y).

In step 1111, the respective regions FSRI2_1 (X, Y, Z), FSRI2_2 (X, Y, Z), FSRI2_3 (X, Y, Z), and FSRI2_4 (X, Y, Z), divided in the step 1007, are regarded as search regions, and the respective template images TRI1_1 (X, Y), TRI1_2 (X, Y), TRI1_3 (X, Y), and TRI1_4 (X, Y), corresponding to the former, are regarded as templates, thereby executing template matching, and calculating maximum correlation values ME 1, ME 2, ME 3, and ME 4, in the respective regions.

In step 1112, the two maximum correlation values ME 1, ME 2, in the region (1), and the region (2), respectively, are compared with each other to thereby store the center coordinates MEPY_T, MEPY_S of the template image, and a search-result image, having a higher correlation value, respectively. Similarly, in step 1113, the two maximum correlation values ME 3, ME 4, in the region (3), and the region (4), respectively, are compared with each other to thereby store the center coordinates MEPY_T, MEPY_S of the template image, and a search-result image, having a higher correlation value, respectively.

In step 1114, the rotational-transfer misregistration amount $\Delta\beta$ of FSRI2 (X, Y, Z), against ChRI1 (X, Y, Z), when the y-axis is the rotational axis, is calculated from the respective center coordinates MEPY_T, MEPY_S. Similarly, in step 1115, the rotational-transfer misregistration amount $\Delta\alpha$ of FSRI2 (X, Y, Z), against ChRI1 (X, Y, Z), when the x-axis is the rotational axis, is calculated from the respective center coordinates MEPY_T, MEPY_S.

In step 1116, FResult (X, Y, Z) is created by correcting the rotational-transfer misregistration amounts $\Delta\alpha$ and $\Delta\beta$ when the x-axis, and the y-axis are the rotational axes, respectively, using FSRI2 (X, Y, Z). Finally, in steps 117 and 118, CRI1 (X, Y, Z) and FResult (X, Y, Z) are outputted, respectively.

In the processing described as above, parallel-translation misregistration $\Delta X$, $\Delta Y$, $\Delta Z$, and rotational-transfer misregistration $\Delta\alpha$, $\Delta\beta$ can be further corrected against the results of the misregistration-correction executed in the step 1006.

The misregistration-correction algorithm in the step 1007 differs from the algorithm in the step 1006 in that the rotational-transfer misregistration $\Delta\alpha$ and $\Delta\beta$ are corrected using information on the XY plane image. The continuously tilted images photographed in the step 501 or the step 1001, and in the step 503 or the step 1003, are used for each of the two three-dimensional reconstruction images used in the invention, so that the XY-plane image is a sharp image without deterioration in information. For this reason, with the use of the method according the second embodiment, whereby a processing for correcting the rotational-transfer misregistration is performed using the information on the XY-plane image, misregistration-correction precision can be enhanced as compared with the method according to the first embodiment, and the completion image DATI (X, Y, Z) according to the invention, higher in definition, can be created.

LIST OF REFERENCE SIGNS

5: first image detector
7: second image detector
8: computer
10: memory
1a, 11b: communication interface
13: microprocessor
19: an input unit
20: output unit
32: sample holder
71: photograph image
80: main window
81: target rotation-angle input part
82: rotation step-angle input part
83: present rotation-angle display part
84: set tilt-angle input part
85: tilt step-angle input part
86: present tilt-angle display part
87: photograph image display part
88: image-fetch execution button
90: window
91: operation range X input part
92: operation range Y input part
93: operation range Z input part
94: common-line search-angle input part
95: template range input part
96: reconstruction image (1) display part
97: reconstruction image (2) display part

The invention claimed is:

1. An electron microscope provided with an irradiation unit for irradiating an object under observation with an electron beam, first and second image detection units for detecting a response from the object under observation, respectively, a transfer unit for holding and transferring the object under observation, a tilting unit capable of optionally setting a tilt-angle of the object under observation, a rotation unit capable of optionally setting a rotation-angle of the object under observation, and an operation unit for executing various operations, the electron microscope comprising:
   a first storage means for tilting the object under observation at angle steps differing from each other, and storing a first tilted-image group acquired by a photographing unit;
   a rotation means for correcting misregistration of the object under observation by a rotation step-angle to thereby rotate the object under observation up to a set rotation angle;

a second storage means for tilting the object under observation rotated by the rotation means, at angle-steps differing from each other, and storing a second tilted-image group acquired by a photographing unit; and an operation means for creating third, and fourth reconstruction images, obtained by correcting misregistrations of first and second reconstruction images, respectively, the first and second reconstruction images, being created from the first and second tilted-image groups, respectively, and creating a fifth reconstruction image by superimposing the third, and fourth reconstruction images one on the other.

2. The electron microscope according to claim 1, wherein the operation unit executes control such that the rotation means sets a tilt-angle of a sample to the vicinity of 0 degree using the tilting unit, a first reference image is photographed using the first image detection unit to thereby create a target reference image obtained by rotating the first reference image by a target rotation-angle, a second reference image is photographed using the second image detection unit to thereby create a step-reference image obtained by rotating the sample by a step-angle, the sample is rotated by a step-angle using the rotation unit to photograph a step image using the second image detection unit, misregistration amounts are calculated using the step-reference image, and the step image, the object under observation is transferred by the misregistration amounts using the transfer unit to correct the misregistration, creation of the step-reference image, photographing of the step image, calculation of the misregistration amount, and the correction of the misregistration are repeated until the target rotation-angle is reached, a target image is photographed by the first image detection unit, misregistration amounts are calculated using the target reference image, and the target image, and the object under observation is transferred by the misregistration amounts using the transfer unit to thereby correct the misregistration.

3. The electron microscope according to claim 1, wherein the operation means performs an operation comprising the steps of:

calculating parallel-translation misregistration amounts of the second reconstruction image, against the first reconstruction image, using three-dimensional cross-correlation, to thereby create a parallel-translation misregistration-correction image obtained by transferring the second reconstruction image by the parallel-translation misregistration amounts;

creating a first addition image, and a second addition image, obtained by adding a density value of every pixel of the first reconstruction image, and the parallel-translation misregistration-correction image, in a z-direction, respectively, to thereby derive a common line from the first addition image, and the second addition image, respectively;

calculating respective rotation angles for causing the common lines in the respective addition images to match each other, to create a first common-line correction image, and a second common-line correction image, obtained by rotating the first reconstruction image, and the parallel-translation misregistration-correction image by the respective rotation angles so as to cause the respective common lines to match each other;

creating a first sliced image by extracting an optional plane from a plane perpendicular to the common line from the first common-line correction image, and a second sliced image by extracting a plane at the same coordinates as those of the first sliced image from the plane perpendicular to the common line from the second common-line correction image; and calculating a rotational-transfer misregistration amount of the second sliced image, against the first sliced image, and creating a rotational-transfer misregistration-correction image obtained by rotating the second common-line correction image by the rotational-transfer misregistration amount with the use of the common line as the rotation axis, thereby outputting the first common-line correction image as the third reconstruction image, and the rotational-transfer misregistration-correction image as the fourth reconstruction image.

4. The electron microscope according to claim 3, wherein the operation means performs an operation comprising the steps of:

calculating parallel-translation misregistration amounts of the fourth reconstruction image, against the third reconstruction image, using three-dimensional cross-correlation, after the step of creating the rotational-transfer misregistration-correction image;

creating a parallel-translation misregistration-correction image obtained by transferring the fourth reconstruction image by the parallel-translation misregistration amounts;

creating a feature-extraction image obtained by extracting a feature of the third reconstruction image;

dividing the feature-extraction image into one region or a plurality of regions;

dividing the parallel-translation misregistration-correction image into one region or a plurality of regions;

calculating respective integrated values of density values in a template region in the respective regions of the feature-extraction image, while transferring the template region to thereby search the template region where the respective integrated values are at the maximum;

storing the respective template regions of the third reconstruction image as template images in the respective regions, and assuming the respective regions of the parallel-translation misregistration-correction image, corresponding to the respective template images, as respective search-images;

calculating regions having highest similarity from the respective search-images, and the respective template images, corresponding to each other;

calculating a rotational-transfer misregistration amount of the parallel-translation misregistration-correction image, against the third reconstruction image, from coordinates of the respective template images, and coordinates of the respective regions having highest similarity; and creating a rotational transfer misregistration correction image obtained by rotating the parallel-translation misregistration-correction image by the rotational-transfer misregistration amount, thereby outputting the rotational-transfer misregistration-correction image as the third reconstruction image.

5. The electron microscope according to claim 4, wherein the operation means works out the feature amount by image differentiation.

6. The electron microscope according to claim 4, wherein the operation means works out the feature amount by image binarization.

7. The electron microscope according to claim 4, wherein the operation means works out the feature amount using the fourth reconstruction image.

8. An electron-microscope image-reconstruction system using a measuring device provided with an irradiation unit for irradiating an object under observation with an electron beam, first and second image detection units for detecting a response from the object under observation, respectively, a transfer unit for holding and transferring the object under observation, a tilting unit capable of optionally setting a tilt-angle of the object under observation, a rotation unit capable of optionally setting a rotation-angle of the object under observation, and an operation unit for executing various operations, the electron microscope image-reconstruction system comprising:

a first storage means for tilting the object under observation at angle steps differing from each other, and storing a first tilted-image group acquired by a photographing unit;

a rotation means for correcting misregistration of the object under observation by a rotation step-angle to rotate the object under observation up to a set rotation angle;

a second storage means for tilting the object under observation rotated by the rotation means, at angle steps differing from each other, and storing a second tilted-image group acquired by a photographing unit; and an operation means for creating third, and fourth reconstruction images, obtained by correcting respective misregistrations of first and second reconstruction images, respectively, the first and second reconstruction images, being created from the first and second tilted-image groups, respectively, and creating a fifth reconstruction image by superimposing the third, and fourth reconstruction images one on the other.

9. The electron-microscope image-reconstruction system according to claim 8, wherein the operation unit executes control such that the rotation means sets a tilt-angle of a sample to the vicinity of 0 degree using the tilting unit, a first reference image is photographed using the first image detection unit to thereby create a target reference image obtained by rotating the first reference image by a target rotation-angle, a second reference image is photographed using the second image detection unit to thereby create a step-reference image obtained by rotating the sample by a step-angle, the sample is rotated by a step-angle using the rotation unit to photograph a step image using the second image detection unit, a misregistration amount is calculated using the step-reference image, and the step image, the object under observation is transferred by the misregistration amount using the transfer unit to correct the misregistration, creation of the step-reference image, and photographing of the step image, calculation of the misregistration amount, and the correction of the misregistration are repeated until the target rotation-angle is reached, a target image is photographed by the first image detection unit, a misregistration amount is calculated using the target reference image, and the target image, and the object under observation is transferred by the misregistration amount using the transfer unit to thereby correct the misregistration.

10. The electron-microscope image-reconstruction system according to claim 8, wherein the operation means performs an operation comprising the steps of:

calculating parallel-translation misregistration amounts of the second reconstruction image, against the first reconstruction image, using three-dimensional cross-correlation, to thereby create a parallel-translation misregistration-correction image obtained by transferring the second reconstruction image by the parallel-translation misregistration amounts;

creating a first addition image, and a second addition image, obtained by adding a density value of every pixel of the first reconstruction image, and the parallel-translation misregistration-correction image, in a z-direction, respectively, to thereby derive a common line from the first addition image, and the second addition image, respectively;

calculating respective rotation angles for causing the common lines in the respective addition images to match each other, to create a first common-line correction image, and a second common-line correction image, obtained by rotating the first reconstruction image, and the parallel-translation misregistration-correction image by the respective rotation angles so as to cause the respective common lines to match each other;

creating a first sliced image by extracting an optional plane from a plane perpendicular to the common line from the first common-line correction image, and a second sliced image by extracting a plane at the same coordinates as those of the first sliced image from the plane perpendicular to the common line from the second common-line correction image;

calculating a rotational-transfer misregistration amount of the second sliced image, against the first sliced image;

creating a rotational-transfer misregistration-correction image obtained by rotating the second common-line correction image by the rotational-transfer misregistration amount with the use of the common line as the rotation axis; and outputting the first common-line correction image as the third reconstruction image, and the rotational-transfer misregistration-correction image as the fourth reconstruction image.

11. The electron-microscope image-reconstruction system according to claim 10, wherein the operation means performs an operation comprising the steps of:

calculating parallel-translation misregistration amounts of the fourth reconstruction image, against the third reconstruction image, using three-dimensional cross-correlation, after the step of creating the rotational-transfer misregistration-correction image;

creating a parallel-translation misregistration-correction image obtained by transferring the fourth reconstruction image by the parallel-translation misregistration amount;

creating a feature-extraction image obtained by extracting a feature of the third reconstruction image;

dividing the feature-extraction image into one region or a plurality of regions, and dividing the parallel-translation misregistration-correction image into one region or a plurality of regions;

calculating respective integrated values $A_i$, $A2_i$, $A3_i$, and $A4_i$ of density values in a template region while transferring the template region in the respective regions of the feature-extraction image to thereby search the template regions, where the integrated values $A_i$, $A2_i$, $A3_i$, and $A4_i$ in the respective regions are at the maximum;

storing the respective template regions of the third reconstruction image as template images in the respective regions, and assuming the respective regions of the parallel-translation misregistration-correction image, corresponding to the respective template images, as respective search-images;

calculating regions having highest similarity from the respective search-images, and the respective template images, corresponding to each other;

calculating the rotational-transfer misregistration amounts of the parallel-translation misregistration-correction image against the third reconstruction image from coordinates of the respective template images and coordinates of the respective regions having highest similarity; and creating a rotational-transfer misregistration-correction image obtained by rotating the parallel-translation misregistration-correction image by the rotational-transfer misregistration amounts, thereby outputting the rotational-transfer misregistration-correction image as the third reconstruction image.

12. The electron-microscope image-reconstruction system according to claim 11, wherein the operation means works out the feature amount by image differentiation.

13. The electron-microscope image-reconstruction system according to claim 11, wherein the operation means works out the feature amount by image binarization.

14. The electron-microscope image-reconstruction system according to claim 11, wherein the operation means works out the feature amount using the fourth reconstruction image.

15. An electron-microscope image-reconstruction method using a measuring device provided with an irradiation unit for irradiating an object under observation with an electron beam, first and second image detection units for detecting a response from the object under observation, respectively, a transfer unit for holding and transferring the object under observation, a tilting unit capable of optionally setting a tilt-angle of the object under observation, a rotation unit capable of optionally setting a rotation-angle of the object under observation, and an operation unit for executing various operations, the electron microscope image-reconstruction method comprising the steps of:

tilting the object under observation at angle steps differing from each other, and storing a first tilted-image group acquired by a photographing unit;

correcting misregistration of the object under observation by a rotation step-angle to rotate the object under observation up to a set rotation angle;

tilting the object under observation rotated at angle steps differing from each other, and storing a second tilted-image group acquired by a photographing unit; and creating third, and fourth reconstruction images, obtained by correcting respective misregistrations of first and second reconstruction images, respectively, the first and second reconstruction images, being created from the first and second tilted-image groups, respectively, and creating a fifth reconstruction image by superimposing the third, and fourth reconstruction images one on the other.

16. The electron-microscope image-reconstruction method according to claim 15, wherein the rotation step comprises the step of:

setting a tilt-angle of a sample to the vicinity of 0 degree using the tilting unit;

photographing a first reference image using the first image detection unit to thereby create a target reference image obtained by rotating the first reference image by a target rotation-angle;

photographing a second reference image using the second image detection unit to thereby create a step-reference image obtained by rotating the sample by a step-angle;

rotating the sample by a step-angle using the rotation unit to photograph a step image using the second image detection unit;

calculating a misregistration amount using the step-reference image, and the step image;

transferring the object under observation by the misregistration amount using the transfer unit to correct the misregistration;

repeating creation of the step-reference image, photographing of the step image, calculation of the misregistration amount, and the correction of the misregistration until the target rotation-angle is reached, photographing a target image by the first image detection unit to calculate misregistration amounts using the target reference image, and the target image; and transferring the object under observation by the misregistration amounts using the transfer unit to thereby correct the misregistration.

17. The electron-microscope image-reconstruction method according to claim 15, wherein the step of creating the third, and fourth reconstruction images, comprises the steps of:

calculating parallel-translation misregistration amounts of the second reconstruction image, against the first reconstruction image, using three-dimensional cross-correlation, to thereby create a parallel-translation misregistration-correction image obtained by transferring the second reconstruction image by the parallel-translation misregistration amounts;

creating a first addition image, and a second addition image, obtained by adding a density value of every pixel of the first reconstruction image, and the parallel-translation misregistration-correction image, in a z-direction, respectively, to thereby derive a common line from the first addition image, and the second addition image, respectively;

calculating respective rotation angles for causing the common lines in the respective addition images to match each other, to create a first common-line correction image and a second common-line correction image, obtained by rotating the first reconstruction image, and the parallel-translation misregistration-correction image by the respective rotation angles, respectively, so as to cause the respective common lines to match each other;

creating a first sliced image by extracting an optional plane from a plane perpendicular to the common line from the first common-line correction image, and a second sliced image by extracting a plane at the same coordinates as those of the first sliced image from the plane perpendicular to the common line from the second common-line correction image;

calculating a rotational-transfer misregistration amount of the second sliced image, against the first sliced image;

creating a rotational-transfer misregistration-correction image obtained by rotating the second common-line correction image by the rotational-transfer misregistration amount with the use of the common line as the rotation axis; and outputting the first common-line correction image as the third reconstruction image, and the rotational-transfer misregistration-correction image as the fourth reconstruction image.

18. The electron microscope image-reconstruction method according to claim 17, comprising the steps of:

calculating parallel-translation misregistration amounts of the fourth reconstruction image, against the third reconstruction image, using three-dimensional cross-correlation, after the step of creating the rotational-transfer misregistration-correction image;

creating a parallel-translation misregistration-correction image obtained by transferring the fourth reconstruction image by the parallel-translation misregistration amounts;

creating a feature-extraction image obtained by extracting a feature of the third reconstruction image;

dividing the feature-extraction image into one region or a plurality of regions;

dividing the parallel-translation misregistration-correction image into one region or a plurality of regions;

calculating respective integrated values of density values in a template region in the respective regions of the feature-extraction image, while transferring the template region to thereby search the template region where the respective integrated values are at the maximum;

storing the respective template regions of the third reconstruction image as template images in the respective regions, and assuming the respective regions of the parallel-translation misregistration-correction image, corresponding to the respective template images, as respective search-images;

calculating regions having highest similarity from the respective search-images, and the respective template images, corresponding to each other;

calculating a rotational-transfer misregistration amount of the parallel-translation misregistration-correction image, against the third reconstruction image, from coordinates of the respective template images, and coordinates of the respective regions having highest similarity; and creating a rotational transfer misregistration correction image obtained by rotating the parallel translation misregistration correction image by the rotational transfer misregistration amount, thereby outputting the rotational transfer misregistration correction image as the third reconstruction image.

19. The electron-microscope image-reconstruction method according to claim 18, wherein a feature-amount calculation step is executed by image differentiation.

20. The electron-microscope image-reconstruction method according to claim 18, wherein a feature-amount calculation step is executed by image binarization.

21. The electron-microscope image-reconstruction method according to claim 18, wherein a feature-amount calculation step is executed using the fourth reconstruction image.

22. An electron-microscope image-reconstruction method comprising the steps of:

acquiring a plurality of tilt-images photographed by tilting a sample at sample-tilt axes, differing from each other;

correcting misregistration by a rotation step-angle;

tilting a rotated object under observation in angle-steps, differing from each other, to pick up images thereof;

creating two reconstruction images obtained by correcting respective misregistrations of two reconstruction images created from respective tilt-image groups, and creating one reconstruction image by superimposing one of the two reconstruction images on the other.

* * * * *